(12) United States Patent
Keung et al.

(10) Patent No.: US 10,051,218 B1
(45) Date of Patent: Aug. 14, 2018

(54) STACKED IMAGE SENSOR PIXEL CELL WITH IN-PIXEL VERTICAL CHANNEL TRANSFER TRANSISTOR AND REFLECTIVE STRUCTURE

(71) Applicant: SmartSens Technology (U.S.), Inc., Sshanghai (CN)

(72) Inventors: Ko Ping Keung, Ma On Shan (HK); Zhibin Xiong, Granite Bay, CA (US); Chen Xu, Shanghai (CN); Zexu Shao, Shanghai (CN)

(73) Assignee: SmartSens Technology (U.S.), Inc., Shanghai (CN)

( * ) Notice: Subject to any disclaimer, the term of this patent is extended or adjusted under 35 U.S.C. 154(b) by 0 days.

(21) Appl. No.: 15/583,436

(22) Filed: May 1, 2017

Related U.S. Application Data

(63) Continuation-in-part of application No. 15/424,124, filed on Feb. 3, 2017.

(51) Int. Cl.
  *H04N 5/374* (2011.01)
  *H04N 5/378* (2011.01)
  *H01L 27/146* (2006.01)

(52) U.S. Cl.
  CPC ....... *H04N 5/374* (2013.01); *H01L 27/14616* (2013.01); *H01L 27/14629* (2013.01); *H01L 27/14643* (2013.01); *H04N 5/378* (2013.01)

(58) Field of Classification Search
  CPC .. H04N 5/374; H04N 5/378; H01L 27/14616; H01L 27/14629; H01L 27/14643
  See application file for complete search history.

(56) References Cited

U.S. PATENT DOCUMENTS

| 5,641,694 | A | * | 6/1997 | Kenney | H01L 27/10841 |
| | | | | | 257/E21.131 |
| 7,781,716 | B2 | | 8/2010 | Anderson | |
| 8,933,544 | B2 | | 1/2015 | Mao et al. | |
| 9,344,658 | B2 | | 5/2016 | Dai et al. | |
| 9,478,579 | B2 | | 10/2016 | Dai et al. | |
| 9,520,427 | B1 | * | 12/2016 | Yoo | H01L 27/14614 |
| 9,620,540 | B1 | * | 4/2017 | Yang | H01L 27/14616 |
| 2006/0084195 | A1 | * | 4/2006 | Lyu | H01L 27/14603 |
| | | | | | 438/48 |
| 2008/0135963 | A1 | * | 6/2008 | Akiyama | H01L 27/14603 |
| | | | | | 257/432 |
| 2011/0193940 | A1 | * | 8/2011 | Park | H01L 27/14629 |
| | | | | | 348/46 |

(Continued)

*Primary Examiner* — Abdelaaziz Tissire
(74) *Attorney, Agent, or Firm* — Eric Karich; Karich & Associates

(57) ABSTRACT

A pixel cell has a photodiode, a readout circuit, a vertical transfer transistor and a reflective structure. The photodiode is disposed within a first substrate of a first semiconductor chip for accumulating an image charge in response to light incident upon the photodiode. The readout circuit is disposed within a second substrate of a second semiconductor chip. The vertical transfer transistor is coupled between the photodiode and the readout circuitry to transfer the image charge from the photodiode to the readout circuitry. The reflective structure is positioned between the readout circuit and the photodiode to reflect incident light, that passes through the photodiode without being absorbed, back towards the photodiode for a second chance at being absorbed.

12 Claims, 7 Drawing Sheets

(56) References Cited

U.S. PATENT DOCUMENTS

| | | | | |
|---|---|---|---|---|
| 2012/0268631 A1* | 10/2012 | Takase | ............... | G02B 3/0068 |
| | | | | 348/273 |
| 2013/0092820 A1* | 4/2013 | Takemoto | .............. | H04N 5/369 |
| | | | | 250/208.1 |
| 2014/0211056 A1* | 7/2014 | Fan | ................... | H01L 27/14643 |
| | | | | 348/308 |
| 2015/0035028 A1* | 2/2015 | Fan | ................... | H01L 27/14623 |
| | | | | 257/292 |
| 2015/0108555 A1* | 4/2015 | Jung | ................ | H01L 29/66666 |
| | | | | 257/290 |
| 2017/0179174 A1* | 6/2017 | Yang | ................ | H01L 27/14616 |
| 2017/0278883 A1* | 9/2017 | Kwag | ............... | H01L 27/14614 |
| 2017/0287959 A1* | 10/2017 | Kwag | ............... | H01L 27/14616 |
| 2017/0294468 A1* | 10/2017 | Park | ................ | H01L 27/14616 |

\* cited by examiner

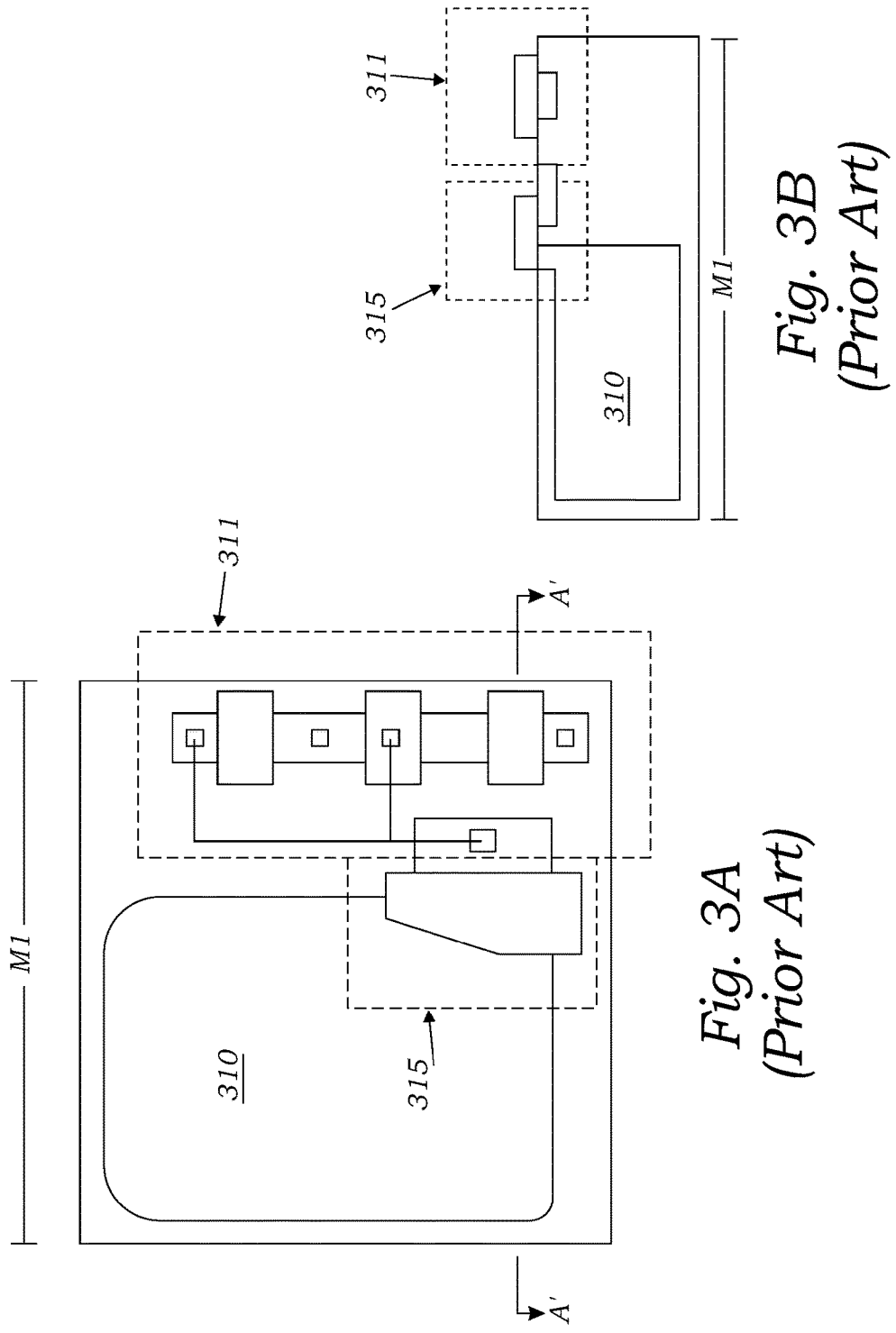

STACKED IMAGE SENSOR PIXEL CELL WITH IN-PIXEL VERTICAL CHANNEL TRANSFER TRANSISTOR AND REFLECTIVE STRUCTURE

CROSS-REFERENCE TO RELATED APPLICATIONS

This application for a utility patent is a continuation-in-part of a previously filed utility patent, still pending, having the application Ser. No. 15/424,124, filed 3 Feb. 2017.

BACKGROUND OF THE INVENTION

Field of the Invention

This invention relates generally to image sensors, and more particularly to CMOS image sensors in a stacked chip formation. The bottom chip includes an array of light sensitive regions and structures to capture an image. The top chip includes circuit elements to extract an image from the array. The image sensor may be incorporated within a digital camera.

Description of Related Art

An image capture device includes an image sensor and an imaging lens. The imaging lens focuses light onto the image sensor to form an image, and the image sensor converts the light into electrical signals. The electric signals are output from the image capture device to other components of a host electronic system. The image capture device and the other components of a host electronic system form an imaging system. Image sensors have become ubiquitous and may be found in a variety of electronic systems, for example a mobile device, a digital camera, a medical device, or a computer.

A typical image sensor comprises a number of light sensitive picture elements ("pixels") arranged in a two-dimensional array. Such an image sensor may be configured to produce a color image by forming a color filter array (CFA) over the pixels. The technology used to manufacture image sensors, and in particular, complementary metal-oxide-semiconductor ("CMOS") image sensors, has continued to advance at great pace. For example, the demands of higher resolution and lower power consumption have encouraged the further miniaturization and integration of these image sensors. However, miniaturization has come with the loss of pixel photosensitivity and dynamic range which require new approaches in order to mitigate.

With the decreased pixel size, the total light absorption depth within the substrate becomes insufficient for some light, especially long-wavelength light. This becomes a particular problem for image sensors using backside illumination (BSI) technology wherein the image light is incident upon the backside of the sensor substrate. In BSI technology the sensor Silicon substrate may be only two microns (micrometers) thick which is adequate to absorb blue light but very inadequate to absorb red light which may require ten microns of thickness to be fully absorbed. An opportunity to improve the amount of absorbed long wavelength light arises when certain reflecting structures are formed on the front side of a BSI image sensor pixel to reflect unabsorbed light back through the pixel.

It is known to form a given image sensor as a so-called stacked image sensor. In a typical arrangement of this type, photodiodes or other light sensitive elements of the pixel array are formed in a first semiconductor die or substrate, while associated circuitry for processing signals from the photosensitive elements is formed in a second semiconductor die or substrate that directly overlies the first semiconductor die or substrate. These first and second semiconductor die or substrates are more generally referred to herein as sensor and circuit chips, respectively. More precisely, the first and second semiconductor die are formed alongside many other like die on the first and second semiconductor wafers which are stacked, after aligning associated inter-wafer electrical interconnects, and diced or cut into a stacked assembly of commonly called semiconductor chips. When reference is made to stacking two chips it is understood that in common practice two wafers are stacked and diced into chips that remain stacked to form an electrical system such as a stacked image sensor. Also the inter-wafer electrical interconnects coupling the sensor and circuit wafers may be referred to as inter-chip interconnects while intra-wafer interconnects and intra-chip interconnects refer to interconnections formed among devices residing on the same wafer and chip respectively. An advantage associated with this arrangement includes that the resulting image sensor system occupies a reduced area compared with not stacked arrangements. An additional advantage is that different manufacturing methods and materials may be used to fabricate each chip allowing independent optimizations to be employed.

An opportunity for improvement of stacked image sensors in which the sensor and circuit chips are interconnected at each pixel element arises when certain novel circuit elements are employed at the interconnections and certain novel reflecting structures are employed behind the pixel. The present invention fulfills these needs and provides further advantages as described in the following summary.

SUMMARY OF THE INVENTION

The present invention teaches certain benefits in construction and use which give rise to the objectives described below.

The present invention provides a pixel cell that has a photodiode, a vertical channel transfer transistor, a reflective structure and a readout circuit. The photodiode is disposed within a first substrate of a first semiconductor chip for accumulating an image charge in response to light incident upon the photodiode. The readout circuit is disposed within a second substrate of a second semiconductor chip. The vertical channel transfer transistor is coupled between the photodiode and the readout circuitry to transfer the image charge from the photodiode to the readout circuitry. The reflective structure is positioned between the readout circuit and the photodiode to reflect incident light, that passes through the photodiode without being absorbed, back towards the photodiode for a second chance at being absorbed. Reflecting light back towards the photodiode may reduce crosstalk among adjacent pixel cells and enhance signal-to-noise ratio. Since longer wavelength light is more likely than shorter wavelength light to pass through a substrate unabsorbed, the reflective structure may improve the collection efficiency of longer wavelength light more so than short wavelength light.

A primary objective of the present invention is to provide an image sensor pixel having advantages not taught by the prior art.

Another objective is to provide a pixel cell that occupies less area and may thereby reduce pixel array size and manufacturing cost.

Still another objective is to provide a pixel cell that reduces pixel crosstalk, enhances quantum efficiency of longer wavelength light, and enhances signal-to-noise ratio.

Other features and advantages of the present invention will become apparent from the following more detailed description, taken in conjunction with the accompanying drawings, which illustrate, by way of example, the principles of the invention.

BRIEF DESCRIPTION OF THE DRAWINGS

The accompanying drawings illustrate the present invention. In such drawings:

FIG. 3A is a diagram illustrating a prior art pixel cell layout wherein photodiode, transfer transistor, and photodiode occupy the same semiconductor wafer or chip;

FIG. 3B is a cross section diagram of the prior art pixel cell shown in FIG. 3A;

DETAILED DESCRIPTION OF THE INVENTION

The above-described drawing figures illustrate the invention, a stacked image sensor pixel cell with in-pixel vertical channel transfer transistor and light reflecting structure for the improvement of stacked image sensors. Various embodiments of the stacked image sensor are disclosed herein. In the following description, numerous specific details are set forth in order to provide a thorough understanding of the present invention. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects. A substrate may have a front side and a back side. Any fabrication process that is performed from the front side may be referred to as a frontside process while any fabrication process that is performed from the back side may be referred to as a backside process. Structures and devices such as photodiodes and associated transistors may be formed in a front surface of a substrate. A dielectric stack that includes alternating layers of metal routing layers and conductive via layers may be formed on the front surface of a substrate. In a stacked chip arrangement the front sides of two chips may be directly coupled since the electrical interconnects on each chip will most commonly be formed on the front sides of each chip. When reference is made to certain circuit elements residing within or formed in a substrate this is generally accepted to mean the circuits reside on the front side of the substrate.

Figure 1:
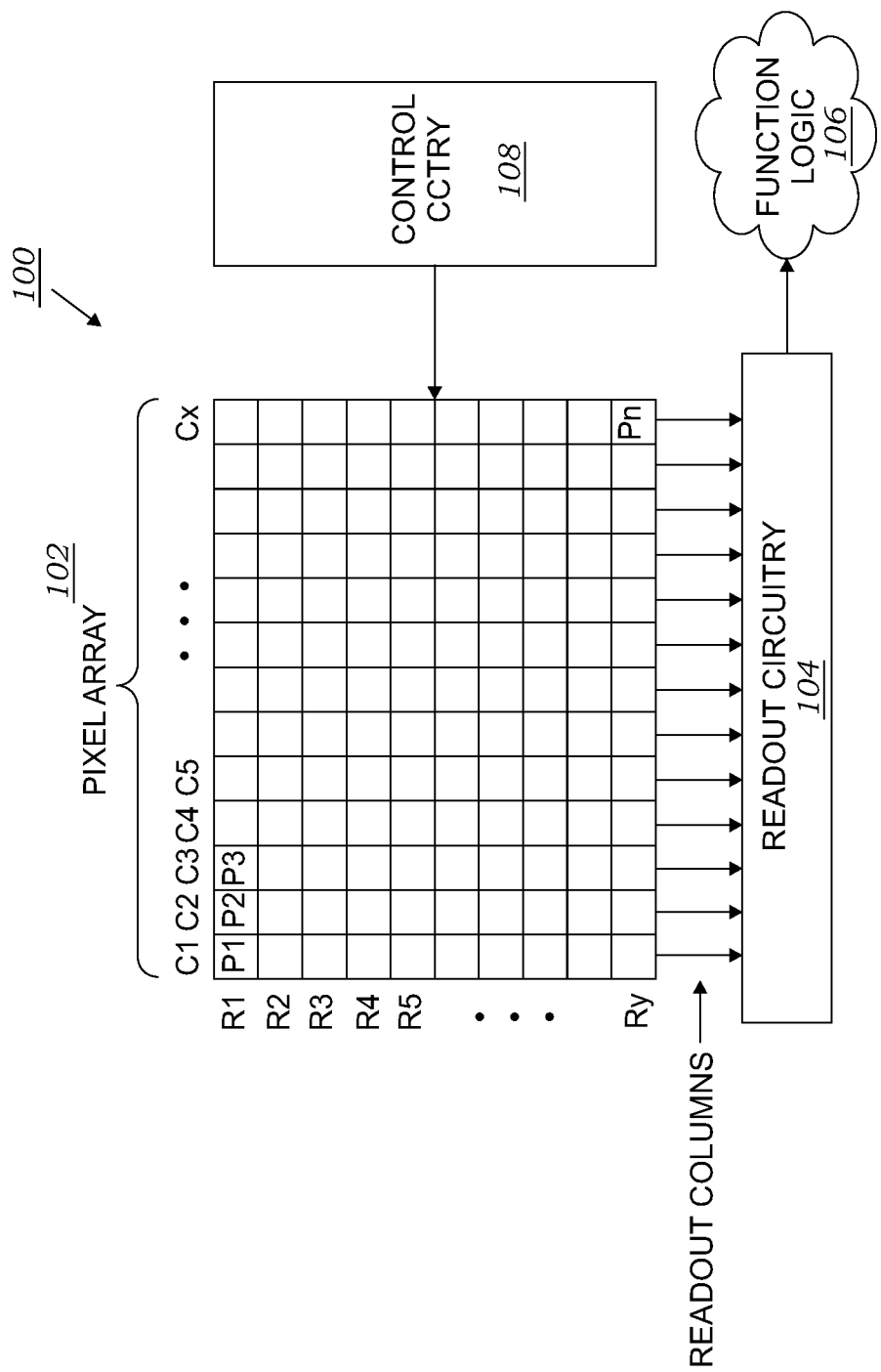
FIG. 1 is a diagram illustrating one example of an imaging system including a pixel array having stacked image sensor pixel cells included in an integrated circuit system having an in-pixel vertical channel transfer transistor according to one embodiment of the present invention.

FIG. 1 is a diagram illustrating one example of an imaging system 100 including an example pixel array 102 having a plurality of image sensor pixels included in an example integrated circuit system featuring an in-pixel vertical channel transfer transistor and light reflecting structure in accordance with the teachings of the present invention. As shown in the depicted example, imaging system 100 includes pixel array 102 coupled to control circuitry 108 and readout circuitry 104, which is coupled to function logic 106. In one example, pixel array 102 is a two-dimensional (2D) array of image sensor pixels (e.g., pixels P1, P2 . . . , Pn). As illustrated, each pixel is arranged into a row (e.g., rows R1 to Ry) and a column (e.g., column C1 to Cx) to acquire image data of a person, place, object, etc., which can then be used to render a 2D image of the person, place, object, etc. In one example, after each pixel has acquired its image data or image charge, the image data is readout by readout circuitry 104 and then transferred to function logic 106. In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may readout a row of image data at a time along readout column lines (illustrated) or may readout the image data using a variety of other techniques (not illustrated), such as a serial readout or a full parallel readout of all pixels simultaneously. In one example, control circuitry 108 is coupled to pixel array 102 to control operational characteristics of pixel array 102. For example, control circuitry 108 may generate a shutter signal for controlling image acquisition. In one example, the shutter signal is a global shutter signal for simultaneously enabling all pixels within pixel array 102 to simultaneously capture their respective image data during a single acquisition window. In another example, the shutter signal is a rolling shutter signal such that each row, column, or group of pixels is sequentially enabled during consecutive acquisition windows.

Figure 2:
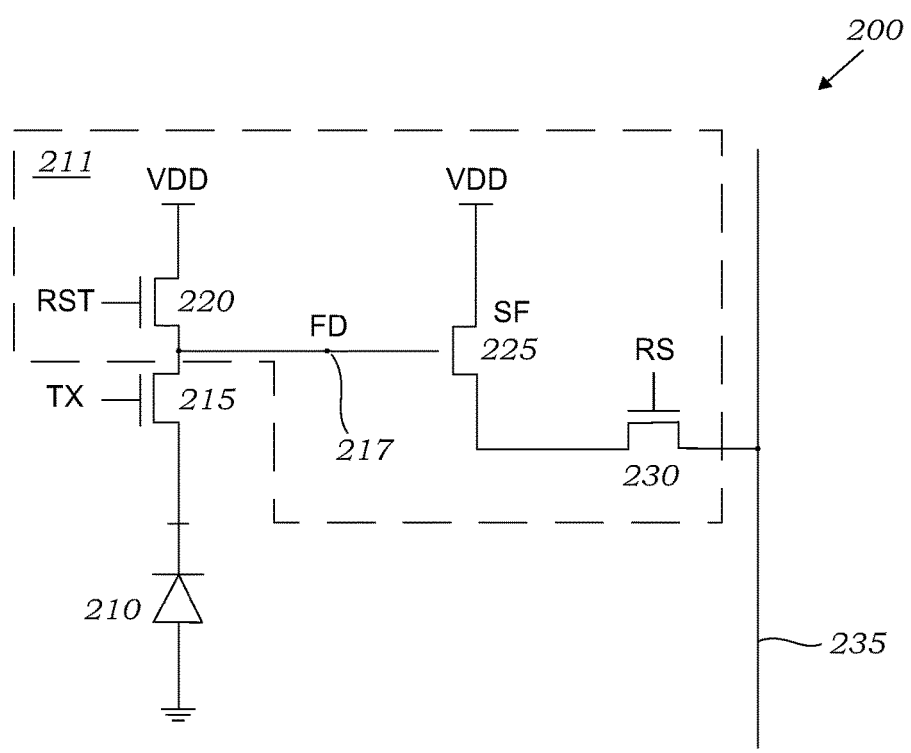
FIG. 2 is an electrical schematic that illustrates one example of a stacked image sensor pixel cell with in-pixel vertical channel transfer transistor according to one embodiment of the present invention.

FIG. 2 is an electrical schematic that illustrates one example of a stacked image sensor pixel cell with in-pixel vertical channel transfer transistor and light reflecting structure in accordance with the teachings of the present invention. Each sensor pixel 200 includes a photodiode 210 (e.g., photosensitive element) and pixel support circuitry 211 as shown. Photodiode 210 may be a "pinned" photodiode as is commonly present in CMOS image sensors. Photodiode 210 may be disposed on a sensor chip of a stacked die system, while pixel support circuitry 211 may be disposed on a separate circuit chip. In one example, pixel support circuitry 211 includes a reset transistor 220, source follower (SF) transistor 225, and row select transistor 230 on a circuit chip coupled to a vertical channel transfer transistor 215 and photodiode 210 on a sensor chip of a stacked die system as shown. In another example, not shown, pixel support circuitry includes a reset transistor 220, source follower (SF) transistor 225, row select transistor 230 and vertical channel transfer transistor 215 on a circuit chip coupled to a photodiode 210 on a sensor chip of a stacked die system. During operation, photosensitive element 210 photo-generates charge in response to incident light during an exposure period. Vertical channel transfer transistor 215 is coupled to receive a transfer signal TX, which causes vertical channel transfer transistor 215 to transfer the charge accumulated in photodiode 210 to floating diffusion (FD) node 217. Floating diffusion 217 is in effect the drain of the transfer transistor while the photodiode is the source of vertical transfer transistor 215. In one embodiment vertical channel transfer transistor is a vertical channel metal-oxide semiconductor field-effect transistor (MOSFET). Reset transistor 220 is coupled between power rail VDD and floating diffusion node 217 to reset sensor pixel 200 (e.g., discharge or charge floating diffusion node 217 and photodiode 210 to a preset voltage) in response to a reset signal RST. Floating diffusion node 217 is coupled to control the gate terminal of source-follower transistor 225. Source-follower transistor 225 is coupled between power rail VDD and row select transistor 230 to amplify a signal responsive to the charge on the floating diffusion FD node 217. Row select transistor 230 couples the output of pixel circuitry from the source-follower transistor 225 to the readout column, or bit line 235, in response to a row select signal RS. Photodiode 210 and floating diffusion node 217 are reset by temporarily asserting the reset signal RST and transfer signal TX. The accumulating window (e.g., exposure period) begins when the transfer signal TX is de-asserted, which permits incident light to photo-generate charge in photodiode 210. As photo-generated electrons accumulate in photodiode 210, its voltage decreases (electrons are negative charge carriers). The voltage or charge on photodiode 210 is representative of the intensity of the light incident on photodiode 210 during the exposure period. At the end of the exposure period, the reset signal RST is de-asserted, which turns off the reset transistor 220 and isolates floating diffusion FD node 217 from VDD. The transfer signal TX is then asserted to couple photodiode 210 to floating diffusion node 217. The charge is transferred from photodiode 210 to the floating diffusion FD node 217 through the vertical channel transfer transistor 215, which causes the voltage of floating diffusion FD node 217 to drop by an amount proportional to photo-generated electrons accumulated on photodiode 210 during the exposure period.

FIG. 3A is a diagram illustrating a common pixel cell layout in the prior art wherein photodiode 310, transfer transistor 315, and photodiode 310 occupy the same semiconductor wafer or chip. FIG. 3B is a cross section diagram of the pixel cell shown in FIG. 3A along its cross section line AA'. Photodiode 310 and pixel circuitry 311 correspond in kind to the photodiode and pixel circuitry denoted as photodiode 210 and pixel circuitry 211 in FIG. 2 except that they occupy the same wafer of chip. Transfer transistor 315 occupies the same location electrically as does transfer transistor 215 in FIG. 2 except that transfer transistor 315 is a commonly understood planar complementary metal-oxide semiconductor field-effect transistor (CMOSFET) wherein its source, channel, and drain components are located within the semiconductor substrate and parallel to the surface of the semiconductor substrate. It is advantageous for die dimension M1, as illustrated in FIGS. 3A and 3B to be as small as possible in order to reduce pixel array size and manufacturing cost. However die dimension M1 is limited by required minimum design rules of a manufacturing technology generation which set the closest approach of for example pixel circuitry 311 to transfer transistor 315. This situation is among the factors that drove the separation of pixel cells into two stacked chips where the pixel circuitry can be stacked over the photodiode and transfer transistor to result in a reduction of die dimension M1.

Figures 4A, 4B:
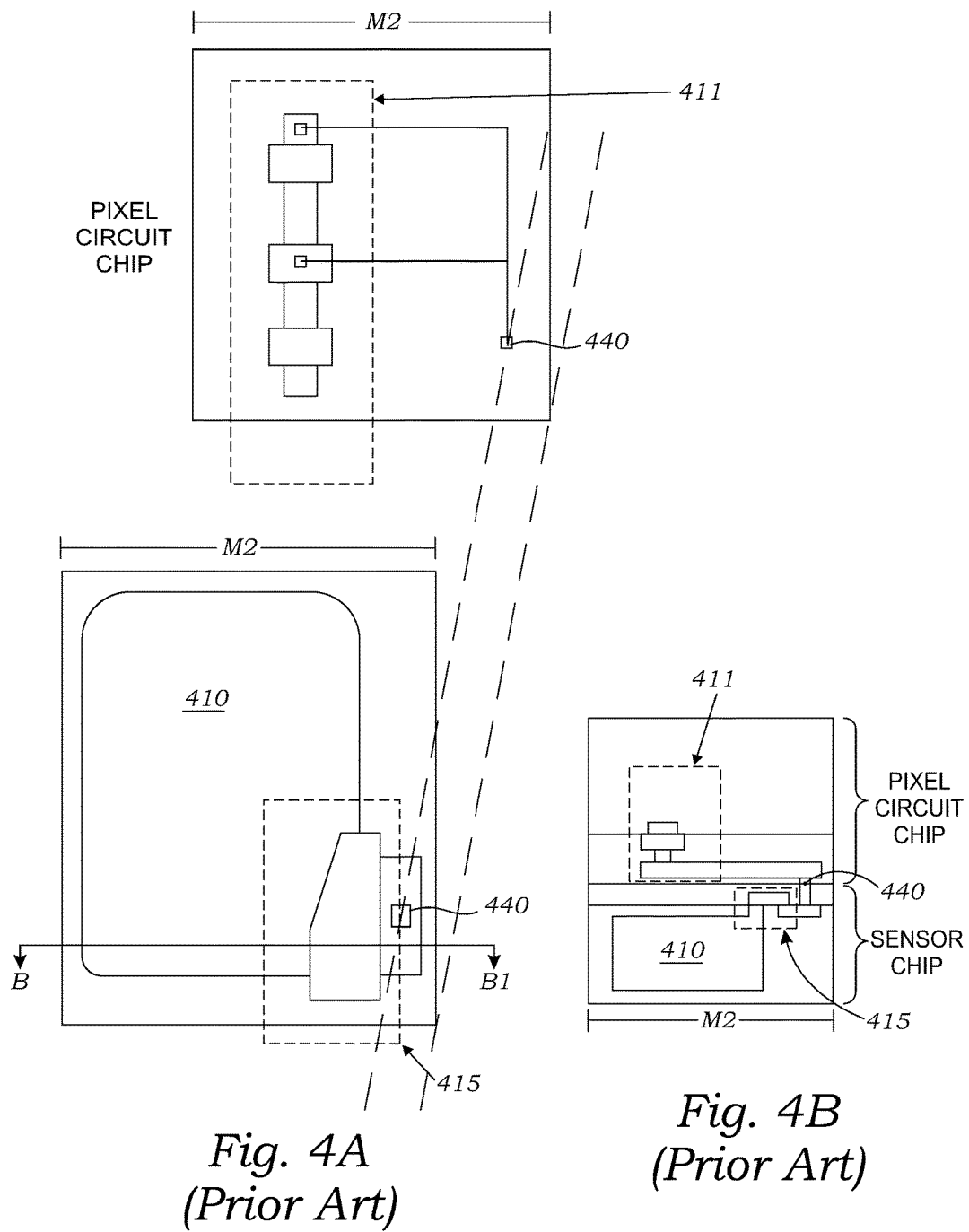
FIG. 4A is an exploded view diagram illustrating a prior art pixel cell layout.
FIG. 4B is a cross section diagram of the prior art pixel cell shown in FIG. 4A.

FIG. 4A is an exploded view diagram illustrating a common pixel cell layout in the prior art wherein photodiode 410 and planar CMOSFET transfer transistor 415 are located on the semiconductor substrate of a sensor wafer or chip and pixel circuitry 411 is located on a separate substrate of a circuit semiconductor wafer or chip. FIG. 4A shows an exploded view of a sensor chip and its components positioned on its upper surface aligned, to a circuit chip with its components positioned on its underside, at inter-chip interconnect 440. In the case of FIG. 4B the underside of the circuit chip is actually the frontside of its substrate as frontside has been previously herein defined. FIG. 4B is a cross section diagram of the pixel cell shown in FIG. 4A along its cross section line BB' including the overlying portion of the circuit chip. FIG. 4B illustrates the two stacked semiconductor chips are electrically coupled by inter-chip interconnect 440. Comparing FIG. 3A and FIG. 4A one skilled in the art will appreciate that, assuming photodiodes 310 and 410 have the same dimensions, die dimension M2 is smaller than dimension M1 thus providing an opportunity for manufacturing cost reduction.

Figures 5A, 5B:
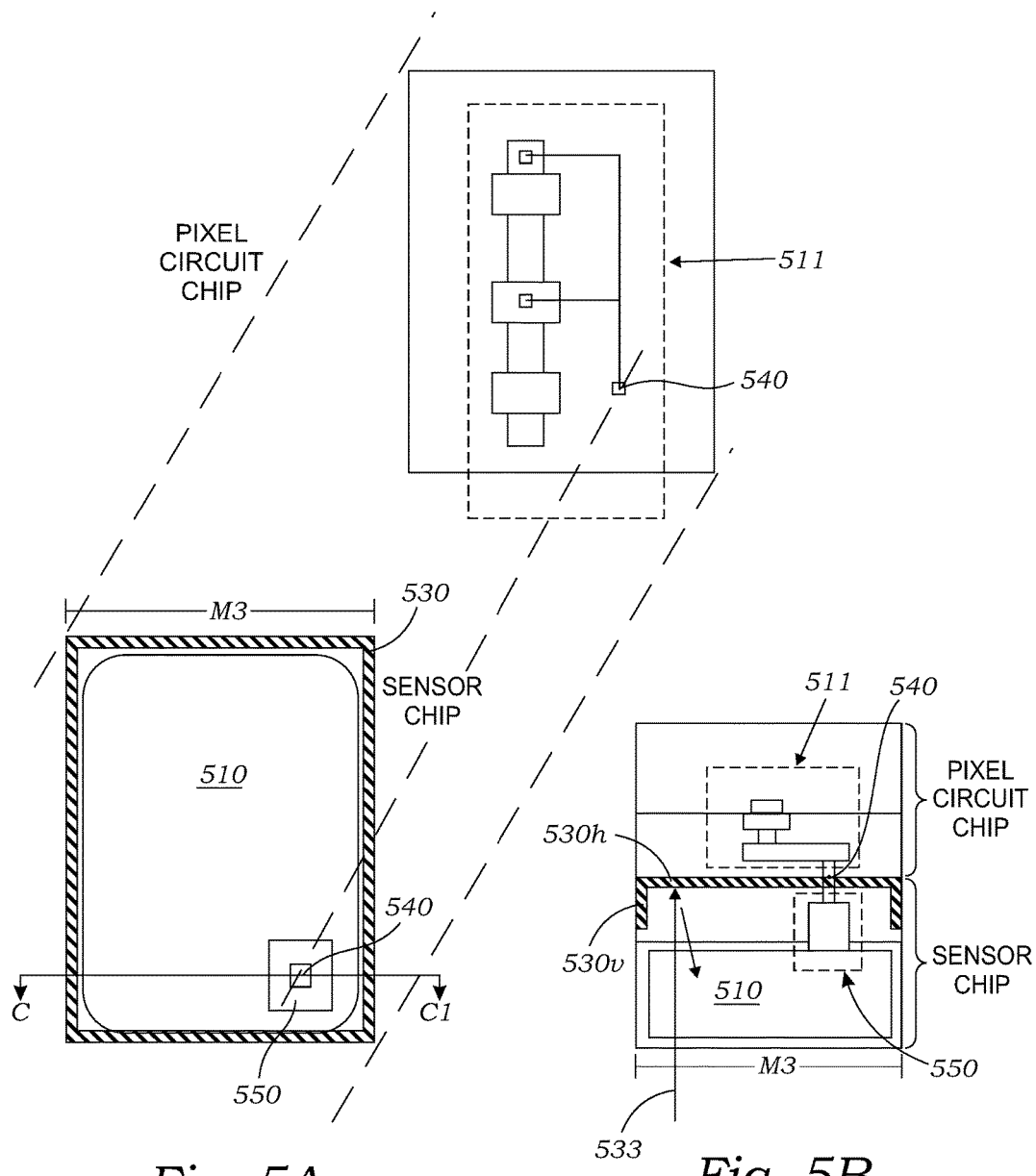
FIG. 5A is an exploded view diagram of a pixel cell in accordance with one embodiment of the invention.
FIG. 5B is a cross section diagram of the pixel cell shown in FIG. 5A.

In the stacked assembly illustrated in FIG. 4A and FIG. 4B the limiting die dimension is determined by the sensor chip. Assuming it is desired to retain the dimensions of the photodiode, one opportunity for further reduction to die dimension is to reduce the transfer transistor size or relocate it within the footprint of the photodiode. FIG. 5A is an exploded view diagram of a pixel cell in accordance with a first embodiment of the invention. FIG. 5A illustrates a pixel cell layout wherein photodiode 510 and vertical channel MOSFET transfer transistor 550 are located on the semiconductor substrate of a sensor wafer or chip and pixel circuitry 511 is located on a separate substrate of a circuit semiconductor wafer or chip. FIG. 5A shows an exploded view of a sensor chip and its components positioned on its upper surface aligned at inter-chip interconnect 540 to a circuit chip with its components positioned on its underside, or as herein previously defined its frontside. FIG. 5B is a cross section diagram of the pixel cell shown in FIG. 5A along its cross section line CC' including the overlying portion of the circuit chip. FIG. 5B illustrates the two stacked semiconductor chips shown in FIG. 5A may be electrically coupled by inter-chip interconnect 540. Comparing FIG. 4A and FIG. 5A one skilled in the art will appreciate that, assuming photodiodes 410 and 510 have the same dimensions, die dimension M3 is smaller than dimension M2 thus providing an opportunity for manufacturing cost reduction.

The sensor chip shown in FIG. 5A and FIG. 5B may comprise a pixel cell utilizing backside illumination technology. Pixel cells utilizing backside illumination technology receive light from the backside of the substrate. Typically image sensor pixel components such as the photodiode, transistors and interconnect structures are formed within one or two microns of the front side of a substrate that may be hundreds of microns thick during the process of fabrication. In order to accommodate backside illumination wherein photons arrive from the back side the thick substrate must be thinned from the backside in order to allow shorter wavelength light, for example blue light, to reach the photodiode region before being absorbed. Blue light photons may be substantially absorbed in as little as one half micron of Silicon while red light photons may require as much as 10 microns of Silicon to be substantially absorbed. The typical substrate thickness of a pixel utilizing backside illumination is near two microns and although all incident short wavelength blue photons are absorbed within the photosensitive photodiode region many of the long wavelength red photons pass through the photosensitive photodiode region unabsorbed. FIG. 5A and FIG. 5B show a reflective structure 530 being inserted above the photosensitive photodiode on the front side of the sensor chip. The function of reflective structure 530 is to reflect light that has passed through photodiode region 510 without being absorbed back towards photodiode region 510 for a second chance at being absorbed there. Reflective structure 530 may therefore increase the absorption efficiency (or quantum efficiency) of the pixel cell with respect to longer wavelength light.

Reflecting structure 530 may comprise a reflecting horizontal surface portion 530h and a reflecting vertical surface portion 530v positioned at the perimeter of the photodiode as shown in FIG. 5A and FIG. 5B. Reflecting horizontal surface portion 530h may be a flat or a concave surface that faces and is parallel to the surface of the sensor chip and photodiode 510 in order to direct reflected light back towards photodiode region 510. FIG. 5B shows light ray 533, a portion of which passes through photodiode region 510 being reflected back towards photodiode region 510 upon reflection by reflecting horizontal surface portion 530h. Light rays may be incident upon the backside of the pixel cell substrate at many angles and their portions which pass through photodiode region 510 may be reflected at many angles, some of which result if light passing a second time through photodiode region 510. Some of the reflected light could travel into an adjacent photodiode resulting in pixel crosstalk were it not for reflecting vertical surfaces 530v.

Figure 6:
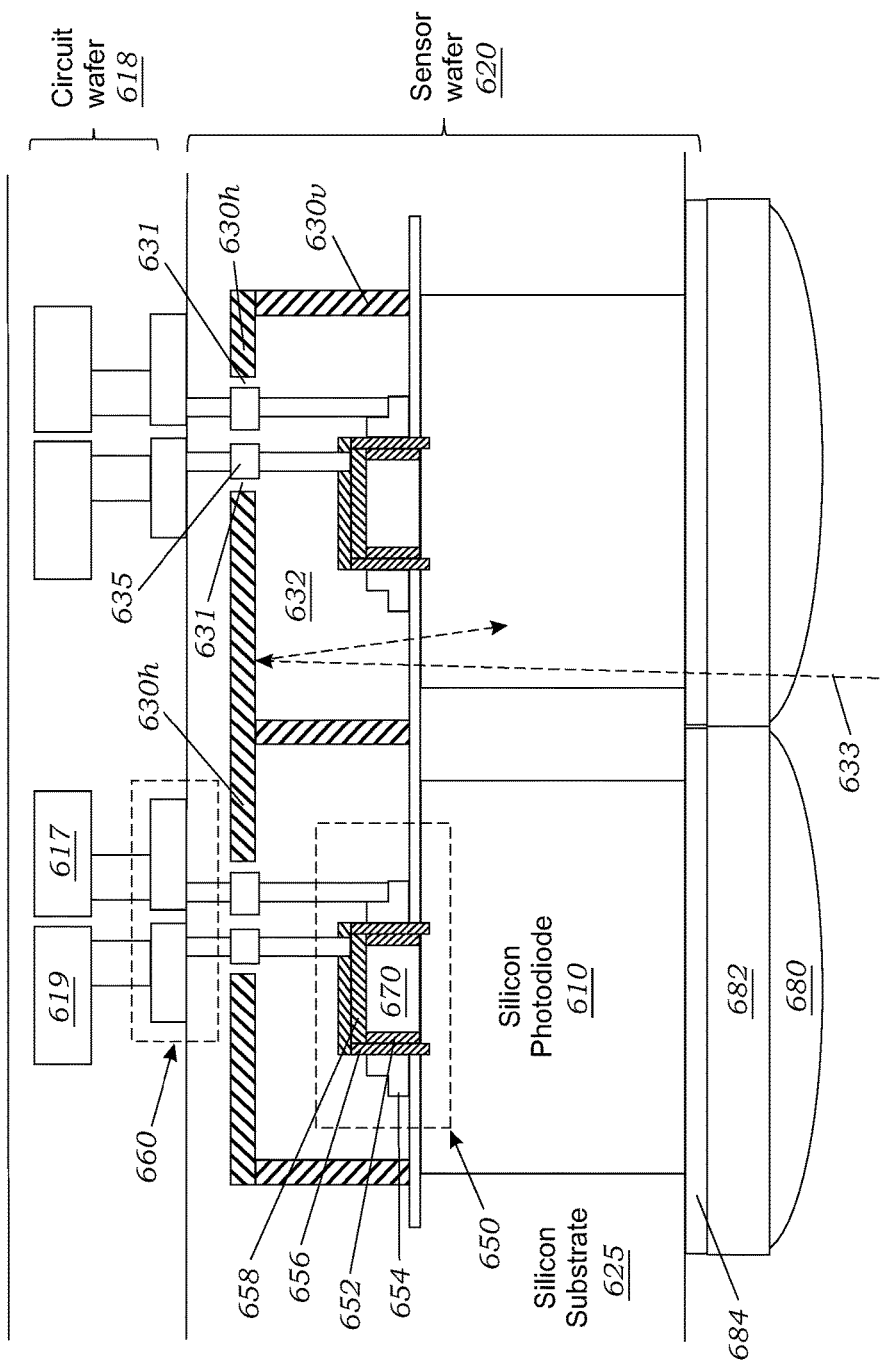
FIG. 6 is a cross section diagram of a pixel cell in accordance with one embodiment of the invention.

FIG. 6 is a cross section diagram of a pixel cell in accordance with an embodiment of the invention. FIG. 6 illustrates in more detail the cross section of the generalized pixel cell illustrated in FIG. 5B and shows many of the enabling features of a vertical channel transfer transistor and a light reflecting structure. FIG. 6 shows circuit wafer or chip 618 stacked on sensor wafer or chip 620 with in-pixel inter-chip interconnects 660 coupling them at their common interface. Circuit chip 618 includes pixel support circuitry 211 as shown in the block diagram of the pixel readout circuits of FIG. 2, i.e., circuit block 619 includes a reset transistor, a source follower (SF) transistor, and a row select (RS) transistor. In addition, circuit chip 618 includes an additional circuit block 617 to provide a transfer signal TX to a transfer transistor.

Sensor chip 620 of FIG. 6 includes a detailed cross section diagram of vertical channel MOSFET transfer transistor 650 and its underlying photodiode 610 according to an embodiment of the invention. Photodiode 610 may be formed in P type silicon substrate 625 and may be comprised of N type silicon region 610 where photo-charge is generated in response to incident light during an exposure period and held for transfer to the readout circuits by vertical channel MOSFET transfer transistor 650. Vertical channel MOSFET transfer transistor 650 derives its function and descriptive name principally from the fact that its MOSFET channel region 652 is oriented with its axis perpendicular to the surface of the semiconductor substrate 625 as shown in FIG. 6. This perpendicular orientation of a MOSFET channel facilitates the positioning of a transfer transistor over a photodiode area which allows a sensor chip's dimensions to be limited mainly by the dimensions of the photodiode. Vertical channel MOSFET transfer transistor 650 is composed of source region 610, i.e. the photodiode region, channel region 652, insulated gate electrode 654, gate insulator 656, and drain region 658. In the embodiment illustrated by FIG. 6, source region 610 may N type silicon, channel region 652 may be P type silicon and drain region 658 may be N type silicon. Persons skilled in the art will recognize that another embodiment may be constructed with a N type silicon substrate, a P type silicon source/photodiode region, a N type channel region, and a P type silicon drain region. Persons skilled in the art will also recognize that the semiconductor materials employed may also include materials other than Silicon such as Germanium, Gallium Arsenide, Silicon Carbide, Graphene, and Boron Nitride and the like, and that the semiconductor materials employed may be crystalline, polycrystalline, or amorphous.

In the embodiment illustrated in FIG. 6, channel region 652 is formed on the vertical side of insulator support structure 670 which acts as a mandrel. The shape of insulator structure 670, may be one of a mesa in a plane which is both parallel to sensor wafer substrate 625 and out of the plane of FIG. 6 and may have the shape of a cylinder, rectangle, octagon or any polygon. The semiconductor material of channel region 652 may be deposited by known deposition techniques onto insulator structure 670 at a thickness small enough to facilitate the switching of electrical carriers within it by the application of a suitable bias voltage on insulated gate electrode 654. Typically such bias voltage is the previously described transfer signal TX. Gate electrode 654 is typically formed of a metal or doped semiconductor and it may be separated and insulated from channel region 652 by thin insulator 656. Gate electrode 654, thin insulator 656 and channel region 652 may be formed as concentric toroids in the instance wherein insulator structure 670 is shaped like a cylinder with axis perpendicular to the plane of sensor wafer substrate 625. The pixel cell embodiment illustrated in FIG. 6 may also include commonly known features such as microlens 680, color filter 682 and anti-reflective coating 684.

FIG. 6 illustrates light reflecting structure 630 comprised of reflecting horizontal surface portion 630h and reflecting vertical surface portion 630v. Reflecting horizontal surface portion 630h may be a flat or a concave surface that faces and is parallel to the surface of the sensor chip and photodiode 610 in order to direct reflected light back towards photodiode region 610. Reflecting structure 630 may be formed within a commonly known dielectric insulator stack 632 which is commonly formed over the electrical components of a planar integrated circuit, for example photodiode 610 and vertical transfer transistor 650. Dielectric insulator stack 632 may include layers of silicon oxide, silicon nitride or other dielectrics within which conductive structures are commonly formed. Light reflecting structure 630 may be formed during the normal first metal interconnect fabrication process steps using a well-known process sequence called dual damascene processing. In a dual damascene process trenches are formed in the insulator which, once filled with reflecting material, form both the vertical and horizontal reflecting surfaces 630h and 630v. In order to accommodate electrical connections 635 from the circuits on circuit wafer 618 to vertical transfer transistor 650 an opening 631 must be formed in reflecting horizontal surface 630h above vertical transfer transistor 650. Dielectric insulator material remains in opening 631 to insulate reflecting horizontal surface 630h from electrical connections 635.

Also illustrated in FIG. 6 is light ray 633, which may enter from the back side of the image sensor pixel through the microlens. Light ray 633 is partially absorbed by photodiode 610.

Figure 7:
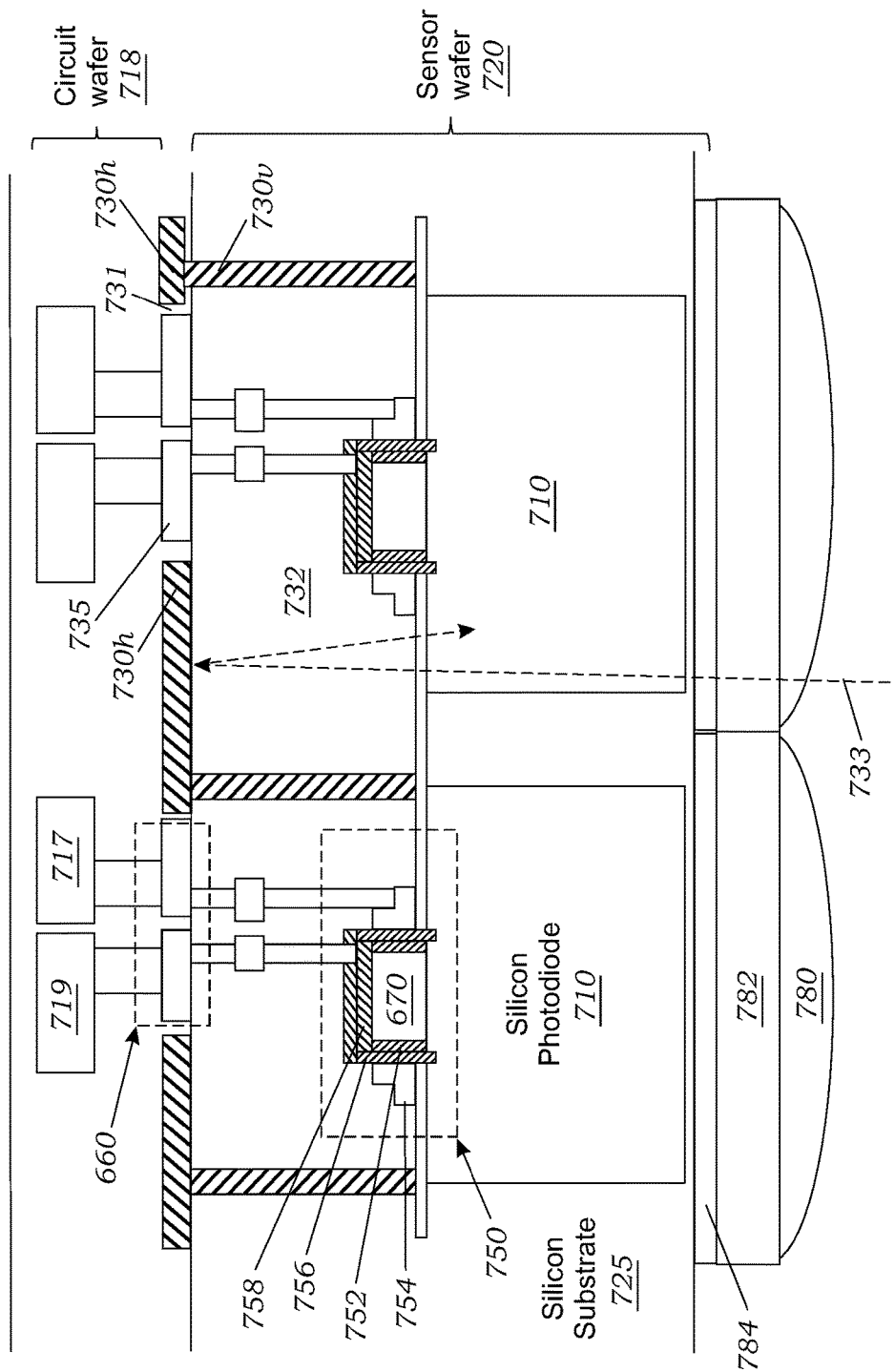
FIG. 7 is a cross section diagram of a pixel cell in accordance with another embodiment of the invention.

The remaining portion of light ray 633 penetrates through substrate 625 into dielectric stack 632 and may reflect back towards photodiode region 610 upon reflection by reflecting horizontal surface portion 630h. Light rays may be incident upon the backside of the pixel cell substrate at many angles and their portions which pass through photodiode region 610 may be reflected at many angles, some of which result if light passing a second time through photodiode region 610. Some of the reflected light could travel into an adjacent photodiode resulting in pixel crosstalk were it not for reflecting vertical surfaces 630v FIG. 7 is a cross section diagram of a pixel cell in accordance with another embodiment of the invention. Most of the elements shown in FIG. 7 correspond to the similarly numbered and positioned elements shown in FIG. 6 except that reflecting horizontal surface 730h is formed on circuit wafer 718 instead of sensor wafer 720. In addition, opening 731 and electrical connections 735, and the dielectric material within opening 731 which insulates reflecting surface 730h from electrical connections 735, differ from the embodiment described in FIG. 6. In the embodiment shown in FIG. 7 reflecting vertical surface 730 may be formed by a the commonly known fabrication process called single damascene processing wherein a trench is etched in the dielectric stack of sensor wafer 720 and then filled with reflecting material. Reflecting horizontal surface 730h may be formed using normal interconnect metal forming processes on circuit wafer 718.

Alternate embodiments of the pixel cells illustrated in FIG. 6 and FIG. 7 may be formed by choice of materials by which to form the light reflecting horizontal and vertical surfaces. One alternative forms the reflecting surfaces out of a metal or combination of metals such as aluminum, copper, and tungsten, gold, silver, titanium, tantalum, chromium, tin, cobalt, and nickel. Another alternative may obtain the reflecting surfaces through the formation a dielectric mirror fabricated from insulators commonly used in integrated circuit manufacture such as silicon nitride, silicon dioxide and hafnium oxide. Another alternative may form the light reflecting surfaces from a non-metallic material that is light reflective such as the polymer polytetrafluorethylene (PTFE). While these particular alternatives are mentioned as illustrative options, alternative materials known in the art may also be used, according to the direction of one skilled in the art.

Reference throughout this specification to "one embodiment," "an embodiment," "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. Directional terminology such as "top", "down", "above", "below" are used with reference to the orientation of the figure(s) being described. Also, the terms "have," "include," "contain," and similar terms are defined to mean "comprising" unless specifically stated otherwise. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

The above description of illustrated examples of the present invention, including what is described in the Abstract, are not intended to be exhaustive or to be limited to the precise forms disclosed. While specific embodiments of, and examples for, the invention are described herein for illustrative purposes, various equivalent modifications are possible without departing from the broader spirit and scope of the present invention. Indeed, it is appreciated that the specific example structures and materials are provided for explanation purposes and that other structures and materials may also be employed in other embodiments and examples in accordance with the teachings of the present invention. These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation.

What is claimed is:

1. A pixel cell, comprising:
 a photodiode disposed within a first substrate of a first semiconductor chip for accumulating an image charge in response to light incident upon the photodiode;
 a readout circuit disposed within a second substrate of a second semiconductor chip;
 a vertical channel transfer transistor coupled between the photodiode and the readout circuitry to transfer the image charge from the photodiode to the readout circuitry, wherein the vertical channel transfer transistor is disposed within the first substrate of the first semiconductor chip, and wherein the vertical channel transfer transistor is a MOSFET transistor comprising:
  a source region coupled to the photodiode;
  a vertical semiconductor channel region coupled to the source region;
  a drain region coupled to semiconductor channel and the readout circuitry;
  an insulated gate electrode formed proximate the vertical semiconductor channel; and
  a polygonal mesa extending upwardly above a surface of the first semiconductor chip, wherein the vertical semiconductor channel region is formed on at least one the vertical walls of a polygonal mesa having an insulating material as the center of said polygonal mesa, wherein the plane of the walls is perpendicular to the plane of the first semiconductor chip;
 a light reflective structure formed between the readout circuit within the second substrate and the photodiode, wherein the light reflecting structure is configured to reflect light back towards the photodiode; and
 wherein the light reflecting structure comprises a reflecting horizontal surface portion positioned over the photodiode area and a reflecting vertical surface portion positioned at the perimeter of the photodiode, wherein the vertical surface portion extends from the perimeter of the horizontal portion toward the photodiode.

2. The pixel cell of claim 1 wherein the light reflective structure is formed on the front surface of the first substrate over the photodiode and the vertical transfer transistor and wherein the light reflective structure is configured to reflect light that passes through the photodiode without being absorbed back towards the photodiode.

3. The pixel cell of claim 2 wherein the light reflective structure includes an opening above the vertical transfer transistor to allow an inter-chip electrical interconnect to directly couple the vertical transfer transistor to the readout circuit.

4. The pixel cell of claim 1 wherein the reflecting horizontal surface and reflecting vertical surface comprise a metal.

5. The pixel cell of claim 1 wherein the reflecting horizontal surface and reflecting vertical surface comprise a dielectric mirror fabricated from insulators.

6. The pixel cell of claim 1 wherein the reflecting horizontal surface and reflecting vertical surface comprise a non-metallic material that is reflective.

7. The pixel cell of claim 1 wherein the light reflective structure is formed on the second substrate between the readout circuit and photodiode on the first substrate, wherein the light reflective structure includes an opening above the vertical transfer transistor to allow an inter-chip electrical interconnect to directly couple the vertical transfer transistor to the readout circuit.

8. The pixel cell of claim 1 wherein the vertical channel transfer transistor is a MOSFET transistor comprising:
    a source region coupled to the photodiode;
    a vertical semiconductor channel region coupled to the source region;
    a drain region coupled to semiconductor channel and the readout circuitry; and
    an insulated gate electrode formed proximate the vertical semiconductor channel.

9. The pixel cell of claim 8 wherein the vertical semiconductor channel region comprises a P type semiconductor and the source and drain regions comprise an N type semiconductor.

10. The pixel cell of claim 8 wherein the insulated gate electrode comprises at least one of a metal and a doped semiconductor formed over an insulating layer, wherein the insulating layer is formed over the channel region.

11. The pixel cell of claim 1 wherein the readout circuit comprises a reset transistor, a source follower amplifier transistor, and a row select transistor.

12. An imaging system component of a digital camera comprising:
a plurality of pixel cells arranged in a two-dimensional array, each of the pixel cells comprising:
    a photodiode disposed within a first substrate of a first semiconductor chip for accumulating an image charge in response to light incident upon the photodiode;
    a readout circuit disposed within a second substrate of a second semiconductor chip; and
    a vertical channel transfer transistor coupled between the photodiode and the readout circuitry to transfer the image charge from the photodiode to the readout circuitry, wherein the vertical channel transfer transistor is disposed within the first substrate of the first semiconductor chip, and wherein the vertical channel transfer transistor is a MOSFET transistor comprising:
        a source region coupled to the photodiode;
        a vertical semiconductor channel region coupled to the source region;
        a drain region coupled to semiconductor channel and the readout circuitry;
        an insulated gate electrode formed proximate the vertical semiconductor channel; and
        a polygonal mesa extending upwardly above a surface of the first semiconductor chip, wherein the vertical semiconductor channel region is formed on at least one the vertical walls of a polygonal mesa having an insulating material as the center of said polygonal mesa, wherein the plane of the walls is perpendicular to the plane of the first semiconductor chip; and
    a light reflective structure formed between the readout circuit within the second substrate and the photodiode, wherein the light reflecting structure is configured to reflect light back towards the photodiode.

* * * * *